US011460147B2

(12) United States Patent
You et al.

(10) Patent No.: US 11,460,147 B2
(45) Date of Patent: Oct. 4, 2022

(54) MULTIFUNCTION DISPLAY STANDS

(71) Applicant: NINGBO TUOTUO RIVER DESIGN COMPANY, Zhejiang (CN)

(72) Inventors: Xiaodong You, Ningbo (CN); Danjun Wang, Ningbo (CN)

(73) Assignee: NINGBO TUOTUO RIVER DESIGN COMPANY, Zhejiang (CN)

( * ) Notice: Subject to any disclaimer, the term of this patent is extended or adjusted under 35 U.S.C. 154(b) by 0 days.

(21) Appl. No.: 17/002,165

(22) Filed: Aug. 25, 2020

(65) Prior Publication Data
US 2022/0065390 A1    Mar. 3, 2022

(51) Int. Cl.
*F16M 11/22* (2006.01)
*F16M 11/24* (2006.01)
*B01D 46/00* (2022.01)
*H04R 1/02* (2006.01)
*H05K 5/02* (2006.01)

(52) U.S. Cl.
CPC ......... *F16M 11/22* (2013.01); *B01D 46/0005* (2013.01); *F16M 11/24* (2013.01); *H04R 1/028* (2013.01); *B01D 2279/40* (2013.01); *B01D 2279/45* (2013.01); *B01D 2279/50* (2013.01); *H04R 2499/15* (2013.01); *H05K 5/0204* (2013.01)

(58) Field of Classification Search
CPC .... F16M 11/12; F16M 11/24; B01D 46/0005; B01D 2279/40; B01D 2279/45; B01D 2279/50; H04R 1/028; H04R 2499/15; H05K 5/0204

USPC .... 248/121, 126, 127, 163.1, 165, 166, 432, 248/444.1
See application file for complete search history.

(56) References Cited

U.S. PATENT DOCUMENTS

| | | | | | |
|---|---|---|---|---|---|
| 3,087,701 | A | * | 4/1963 | Wallace | A47C 20/06 248/166 |
| 3,107,442 | A | * | 10/1963 | Levine | A47B 83/008 434/417 |
| 3,330,534 | A | * | 7/1967 | Collins | E01F 13/02 256/64 |
| 3,336,682 | A | * | 8/1967 | Genin | B43L 1/008 434/416 |
| 4,123,127 | A | * | 10/1978 | Ford | A47B 97/08 312/231 |
| 5,083,390 | A | * | 1/1992 | Edman | G09F 7/18 40/607.02 |
| 6,131,749 | A | * | 10/2000 | Crockett | B60R 7/10 211/105.3 |

(Continued)

FOREIGN PATENT DOCUMENTS

GB          2 354 937       *   4/2001

*Primary Examiner* — Tan Le
(74) *Attorney, Agent, or Firm* — Knobbe Martens Olson & Bear LLP

(57) ABSTRACT

A multifunction display stand configured to support a display, the display stand can include a display mount assembly configured to mount to and support a display, a hub assembly comprising a recess configured to receive a modular unit positioned therein, the modular unit comprising one of: a lighting unit, a mobile power supply unit, an air purifier unit, and a speaker unit, and a legs or other type of support assembly. The modular units can be selectively installed within the recess to provide additional functionality for the display stand as desired.

10 Claims, 11 Drawing Sheets

(56) References Cited

U.S. PATENT DOCUMENTS

| | | | | |
|---|---|---|---|---|
| 6,643,966 B2 * | 11/2003 | Schmitt | ............... | G09F 15/0025 |
| | | | | 40/604 |
| 8,378,620 B2 * | 2/2013 | Reckelhoff | .......... | A61G 12/001 |
| | | | | 320/101 |
| 9,439,505 B2 * | 9/2016 | McPheeters | ............. | B62H 3/00 |
| 10,565,907 B1 * | 2/2020 | Trifone | ............... | G09F 15/0062 |

* cited by examiner

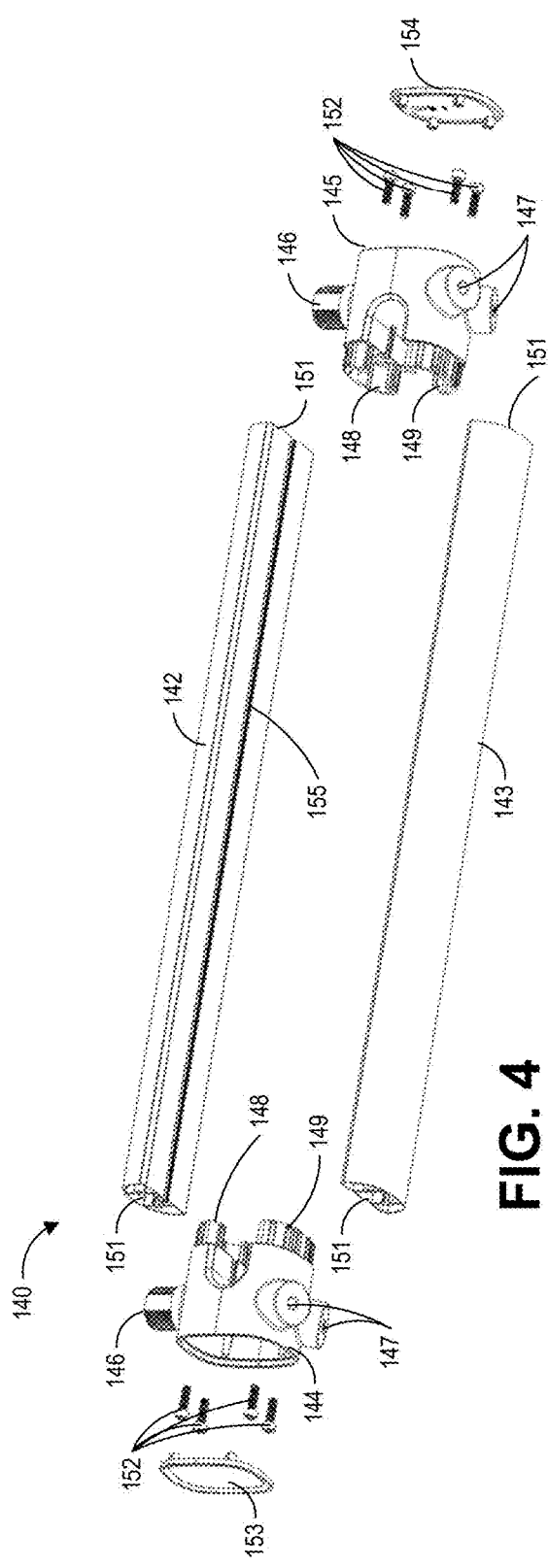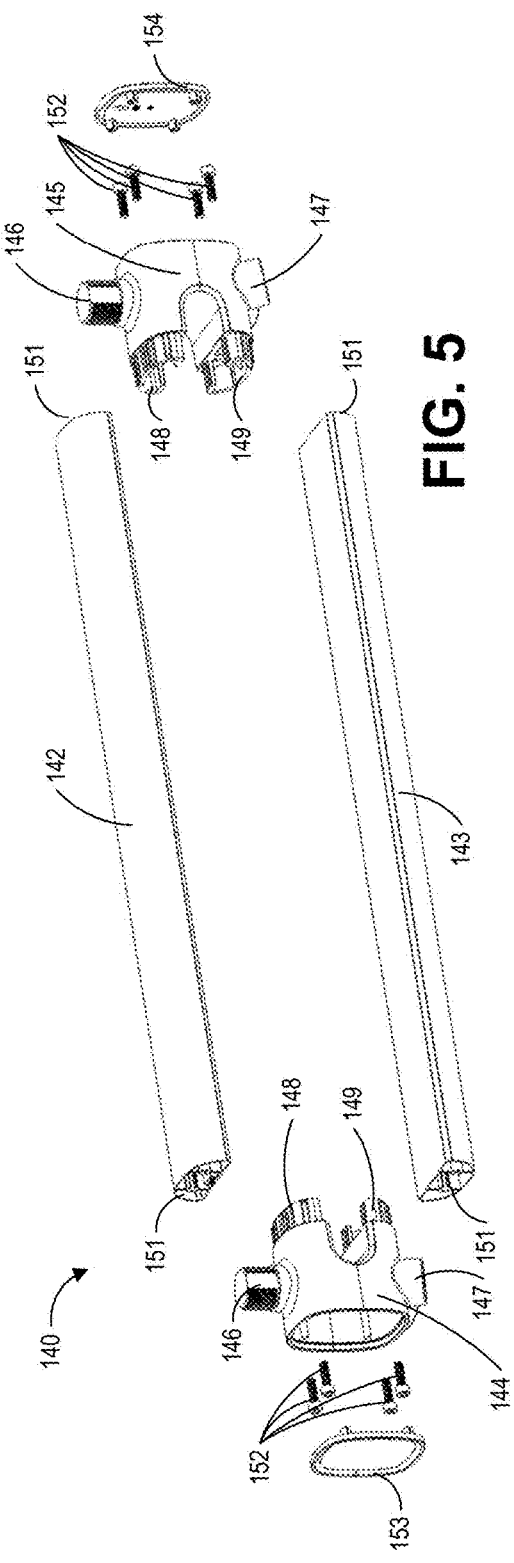

MULTIFUNCTION DISPLAY STANDS

BACKGROUND

Field

This application relates to display stands for supporting displays, such as televisions, monitors, and others. More particularly, this application relates to multifunction display stands that provide additional functionality while supporting a display.

Description

Display stands are used to provide support for displays including televisions, monitors, and others. Display stands often include a mounting assembly configured to mount to the back of the display and a support assembly configured to support and position the mounting assembly. Various types of support assemblies are possible, including legs configured to rest on the ground, wall mount components configured to attach to a wall, table or furniture type support components, as well as others.

SUMMARY

Multifunction display stands as described herein can be configured to provide one or more additional functions while also providing support for a display, such as a television, monitor or other type of display. Often, while using a display, one or more additional functions may also be needed or desired. For example, such additional needs or desires can include, lighting, power, audio, air purification and others.

The multifunction display stands described herein can be configured to support a display while also providing one or more of these additional functions. For example, a multifunction display stand can be configured to support a display, while also including a lighting element to provide lighting, a power supply unit to supply power, an air purifier unit to provide air purification, and/or a speaker unit to provide audio functionality.

In a first aspect, a multifunction display stand configured to support a display is disclosed. The display stand can include a display mount assembly configured to mount to and support a display; a hub assembly comprising a recess configured to receive a modular unit positioned therein, the modular unit comprising one of: a lighting unit, a mobile power supply unit, an air purifier unit, and a speaker unit; and a legs assembly.

The display stand can include one or more of the following features in any combination: (a) wherein the recess comprises a profile configured to correspond to the profile of the modular unit such that the modular unit is configured to be received within the recess; (b) wherein the hub assembly comprises a first end seat, a second end seat, an upper arm extending between the first and seat and the second end seat, and a lower arm extending between the first end seat and the second end seat, wherein the recess is formed between the upper arm and the lower arm; (c) a lighting element integrated into at least one of the upper arm or the lower arm of the hub assembly; (d) wherein each of the first end seat and the second end seat comprise upper and lower flanges configured to be received within recessed ends of the upper and lower arms; (e) wherein the modular unit comprises the mobile power supply unit, and the mobile power supply unit comprises one or more rechargeable batteries configured to power a display supported by the display stand; (f) wherein the modular unit comprises the air purifier unit, and the air purifier unit comprises a HEPA filter, an ionizes, an ozone generator, an electrostatic filter, an activated carbon filter, or a UV light filter; (g) wherein the air purifier unit comprises one or more rechargeable batteries configured to power a display supported by the display stand and the air purifier unit; (h) wherein the modular unit comprises the speaker unit, and the speaker unit comprises one or more speakers; (i) wherein the speaker unit comprises one or more rechargeable batteries configured to power a display supported by the display stand and the speaker unit; (j) wherein the display mount assembly comprises first and second support rods extending upwardly from the hub assembly, and upper and lower crossbeams extending between the first and second support rods, the upper and lower crossbeams configured to mount to the display; (k) wherein a height of at least one of the upper and lower crossbeams on the first and second support rods is adjustable; (l) collars positioned on the first and second support rods for supporting the at least one of the upper and lower crossbeams that is adjustable; (m) wherein the legs assembly extends downwardly from the hub assembly; (n) wherein the display mount assembly comprises a support rod extending upwardly from the hub assembly, and upper and lower crossbeams are attached to the support rod, wherein the upper and lower crossbeams configured to mount to the display; and/or other features as described herein.

In another aspect, a method for supporting a display with a multifunction display stand is described. The method can include providing a display stand comprising a display mount assembly configured to mount to and support a display, and a hub assembly comprising a recess configured to receive a modular unit positioned therein, the modular unit comprising one of: a lighting unit, a mobile power supply unit, an air purifier unit, and a speaker unit; mounting a display to the display mount assembly; and positioning one of the lighting unit, the mobile power supply unit, the air purifier unit, and the speaker unit in the recess.

The method can include one or more of the following additional features in any combination: (a) removing the one of the lighting unit, the mobile power supply unit, the air purifier unit, and the speaker unit from the recess and replacing it with another of the of the lighting unit, the mobile power supply unit, the air purifier unit, and the speaker unit; (b) wherein the one of the one of the lighting unit, the mobile power supply unit, the air purifier unit, and the speaker comprises the mobile power supply, and the method further comprises powering the display with the mobile power supply; (c) providing ambient or mood lighting with a lighting element integrated into the hub assembly; (d) wherein the display comprises a television or computer monitor; (e) wherein the recess comprises a profile configured to correspond to the profile of the modular unit such that the modular unit is configured to be received within the recess; and/or other features as described herein.

BRIEF DESCRIPTION OF THE DRAWINGS

The features and advantages of the multifunction display stands and associated methods described herein will become more fully apparent from the following description and appended claims, taken in conjunction with the accompanying drawings. These drawings depict only several embodiments in accordance with the disclosure and are not to be considered limiting of its scope. In the drawings, similar reference numbers or symbols typically identify similar components, unless context dictates otherwise. The drawings may not be drawn to scale.

FIG. 4 is a bottom perspective exploded view of an embodiment of the multifunction hub assembly of FIG. 3.

FIG. 5 is a top perspective exploded view of an embodiment of the multifunction hub assembly of FIG. 3.

DETAILED DESCRIPTION

This application describes multifunction display stands. The multifunction display stands described herein can be configured to support a display while also providing one or more of these additional functions. For example, a multifunction display stand can be configured to support a display, while also including a lighting element to provide lighting, a power supply unit to supply power, an air purifier unit to provide air purification, and/or a speaker unit to provide audio functionality.

As will be described in more detail below, a multifunction display stand can include a display mount assembly, a multifunction hub assembly, and a legs or other support assembly. The display mount assembly can be configured to attach to a display, such as a television, monitor, or other type of display. The multifunction hub can be configured to provide additional functionality such as lighting, power, air purification, or audio. In some embodiments, a unit, module, or element configured to provide the additional functionality (e.g., a lighting element to provide lighting, a power supply unit to supply power, an air purifier unit to provide air purification, and/or a speaker unit to provide audio functionality) can be integrated directly into the multifunction hub. In other embodiments, the unit(s) configured to provide the additional functionality can be configured as modules configured to be received within an opening of the multifunction hub assembly. The legs or other support assembly can be configured to provide support for the display mount assembly.

The following discussion presents detailed descriptions of several embodiments. These embodiments are not intended to be limiting, and modifications, variations, combinations, etc., are possible and within the scope of this disclosure.

Figure 1:
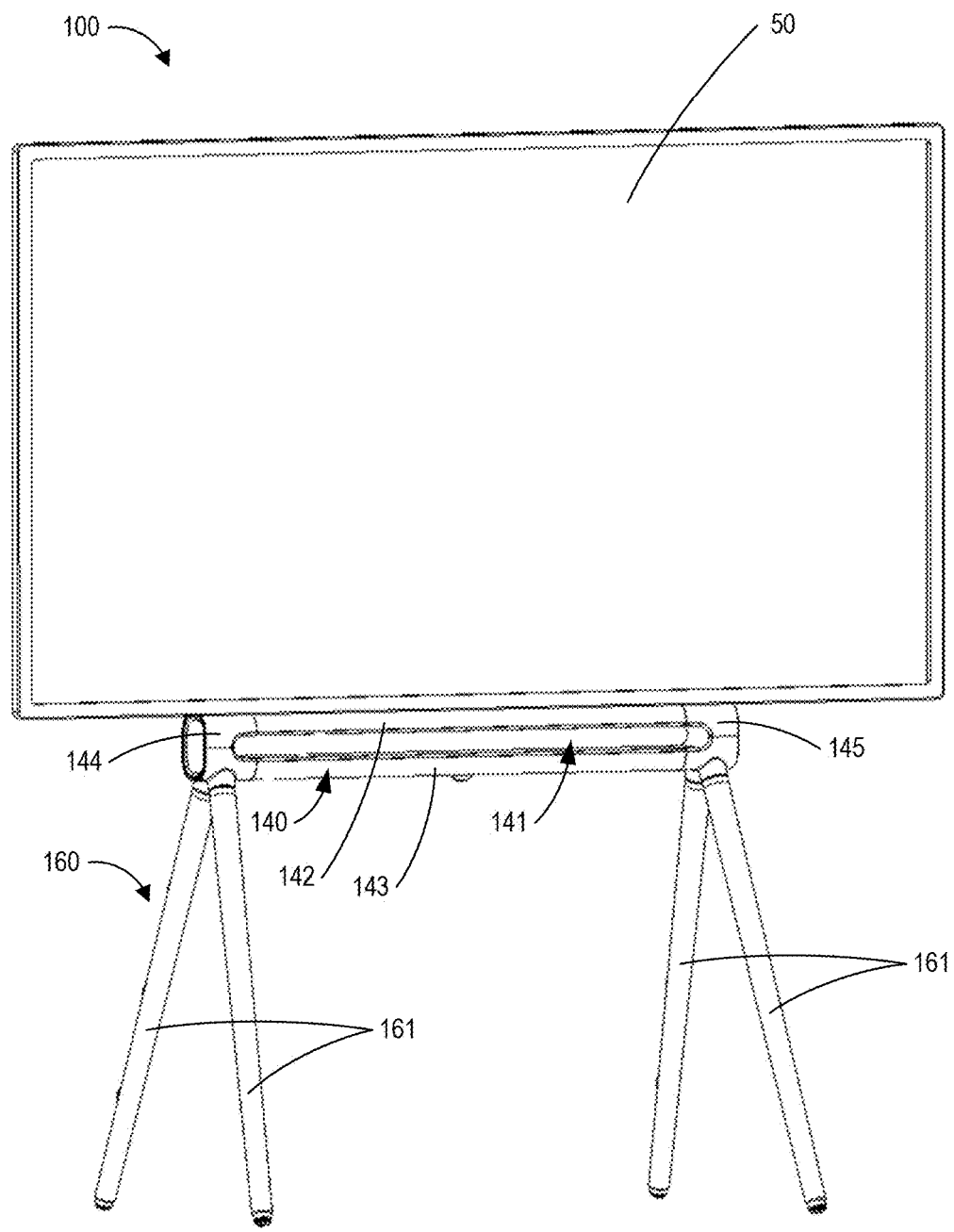
FIG. 1 is a perspective view of an embodiment of a multifunction display stand with a display installed thereon.

FIG. 1 is a perspective view of an embodiment of a multifunction display stand 100 (also referred to herein as display stand 100) with a display 50 installed thereon. The display stand 100 is considered multifunction because it can provide more than one function. For example, in addition to the traditional function of supporting the display 50, the display stand 100 can also provide one or more functions that are not typically associated with a display stand. These additional functions can include, for example, providing a lighting feature, providing a power supply feature, providing an air purifier feature, and/or providing an audio feature, among other functions. In some embodiments, the additional functionality is provided by a module that is integrated into (e.g., a permanent part of) the display stand 100. In other embodiments, the additional functionality can be provided by a removable module that can be replaceably coupled to the display stand 100.

In the illustrated embodiment of FIG. 1, the display stand 100 includes a display mount assembly 120 (not visible in FIG. 1 because it is behind the display 50, but shown, for example, in FIGS. 2, 3, 9 and 10), a multifunction hub assembly 140, and a legs assembly 160. In general, the mount assembly 120 is configured to allow attachment to the display 50, the multifunction hub assembly 140 (also referred to herein as the hub assembly 140) is configured to enable or provide an additional function for the display stand (e.g., lighting, power, air purification, audio, or others), and the legs assembly 160 is configured to support the mount assembly 120 and the hub assembly 140.

As mentioned above, the display mount assembly 120 can be configured to allow the display 50 to connect, attach, mount, or mount thereto. In some embodiments, the display mount assembly 120 can include fasteners (e.g., mechanical fasteners such as bolts, clips, or others) that secure the display 50 to the mount assembly 120. In some embodiments, the display mount assembly 120 attaches directly to the display 50. In some embodiments, the display mount assembly 120 is configured to attach to the display 50 using one or more mounting brackets. Such mounting brackets can include fixed brackets, tilting brackets, and full-motion brackets, among others. Brackets such as tilting brackets and full-motion brackets can allow some degree of movement between the display stand 100 and the display 50. In some embodiments, the display mount assembly 120 can utilize standard mounting configurations such as VESA mounts or others. In some embodiments, the display mount assembly 120 does not directly attach to the display 50 and, rather, provides passive support therefore. For example, in some embodiments, the display mount assembly 120 provides support for the display 50 in a manner similar to an easel.

Figure 2:
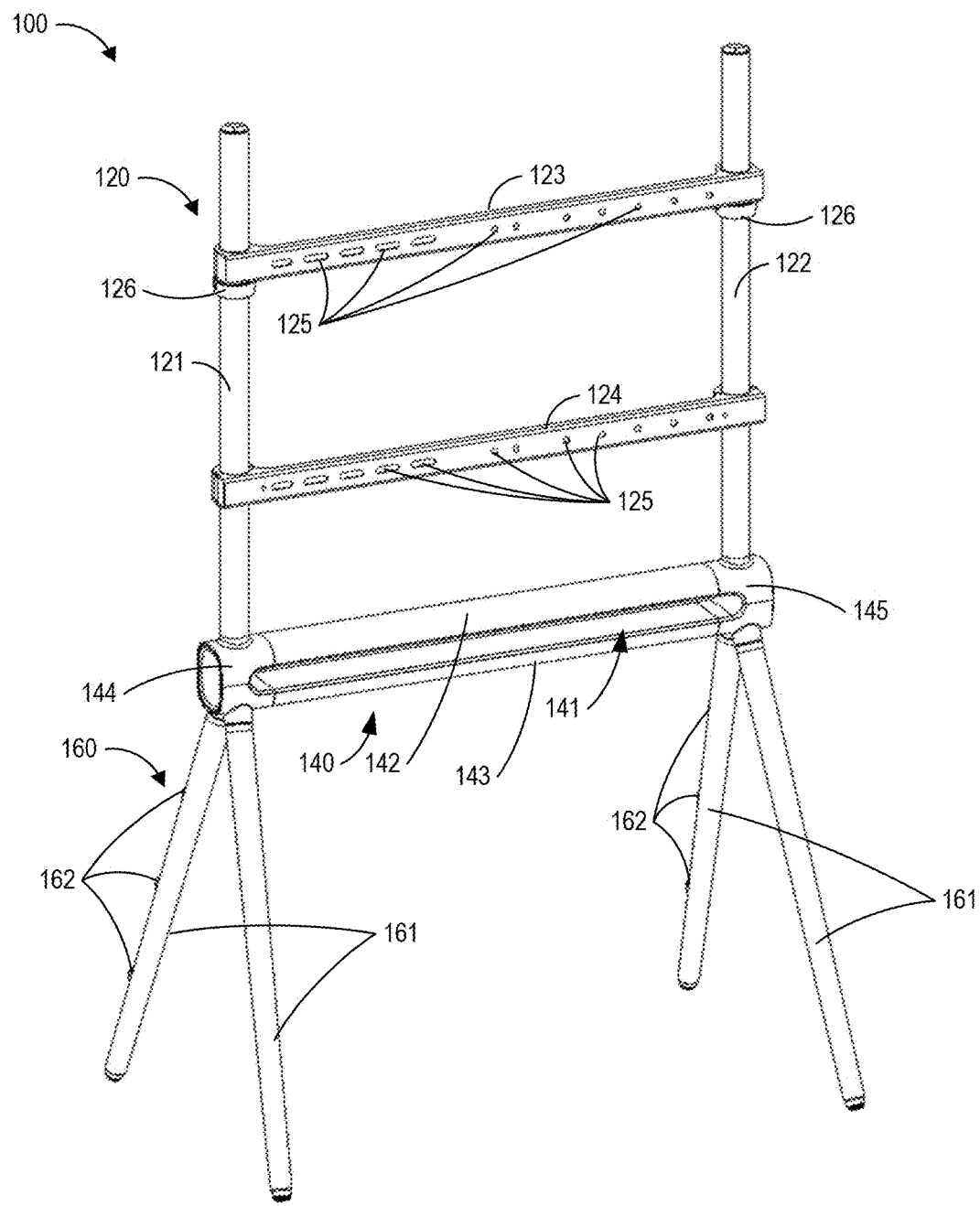
FIG. 2 is a perspective view of the multifunction display stand of FIG. 1 with the display removed therefrom.
Figure 3:
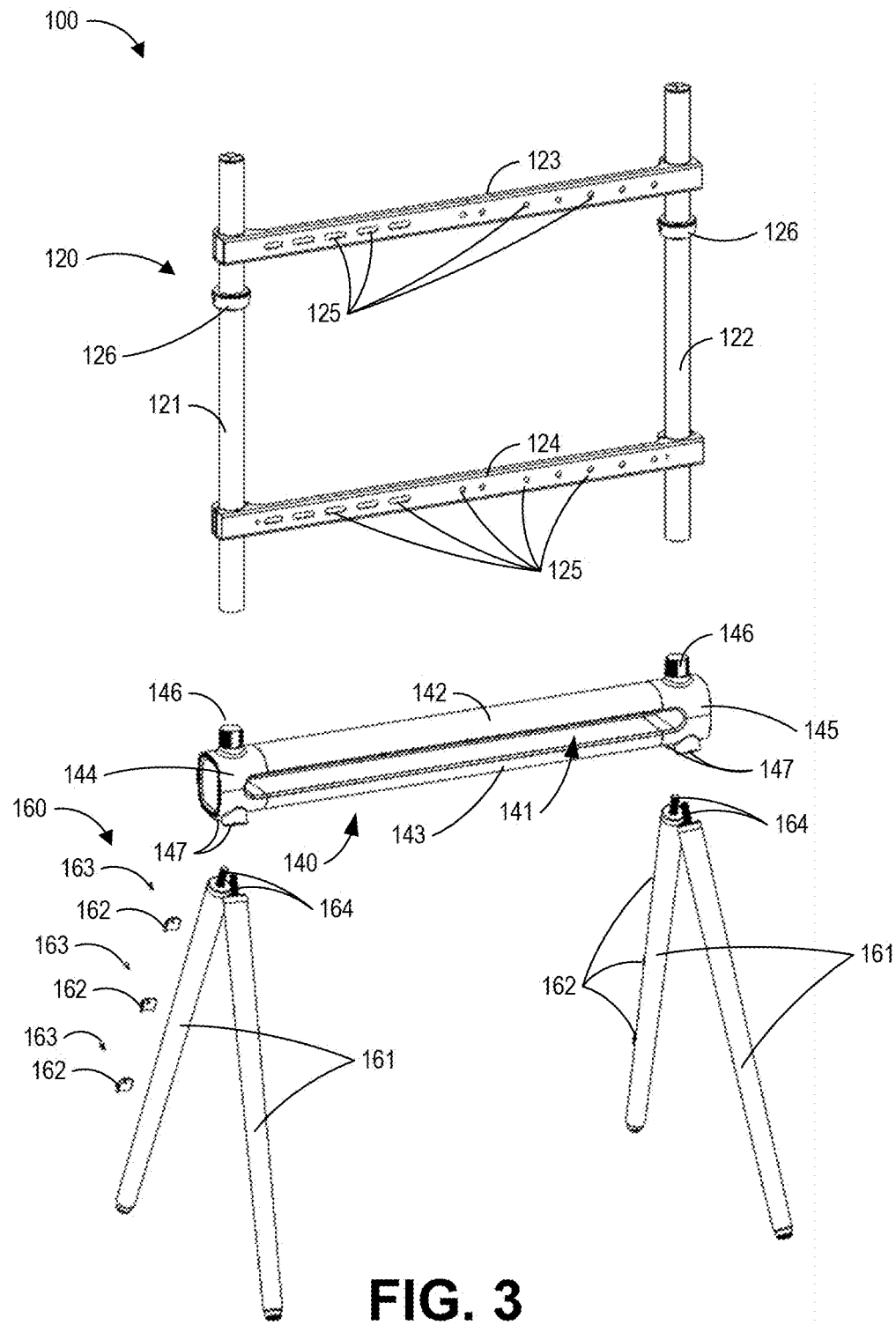
FIG. 3 is a partially exploded view of the multifunction display stand of FIG. 2 including a display mount assembly, a multifunction hub assembly, and a legs assembly.
Figure 9:
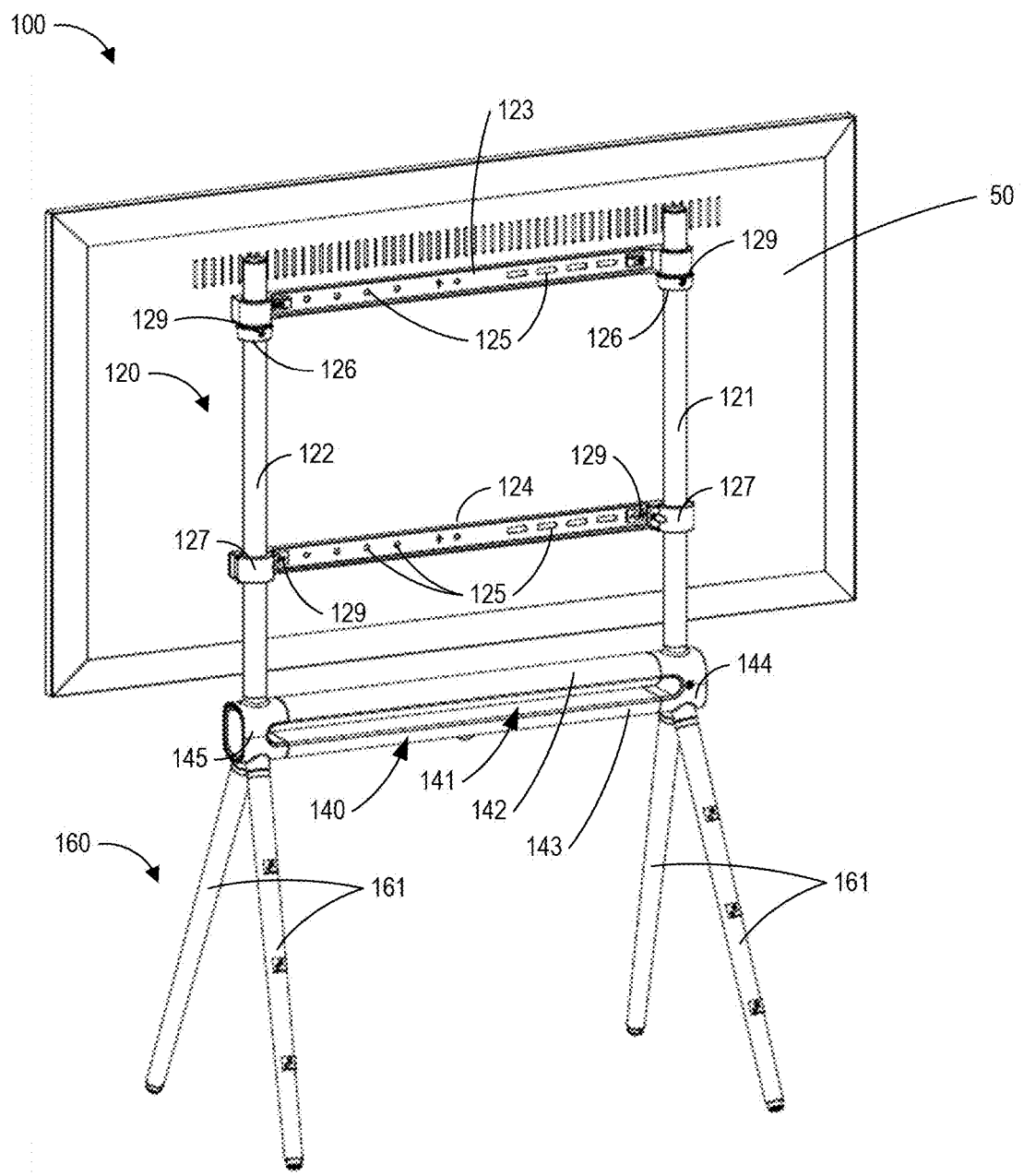
FIG. 9 is a back view of the multifunction display stand of FIG. 1.
Figure 10:
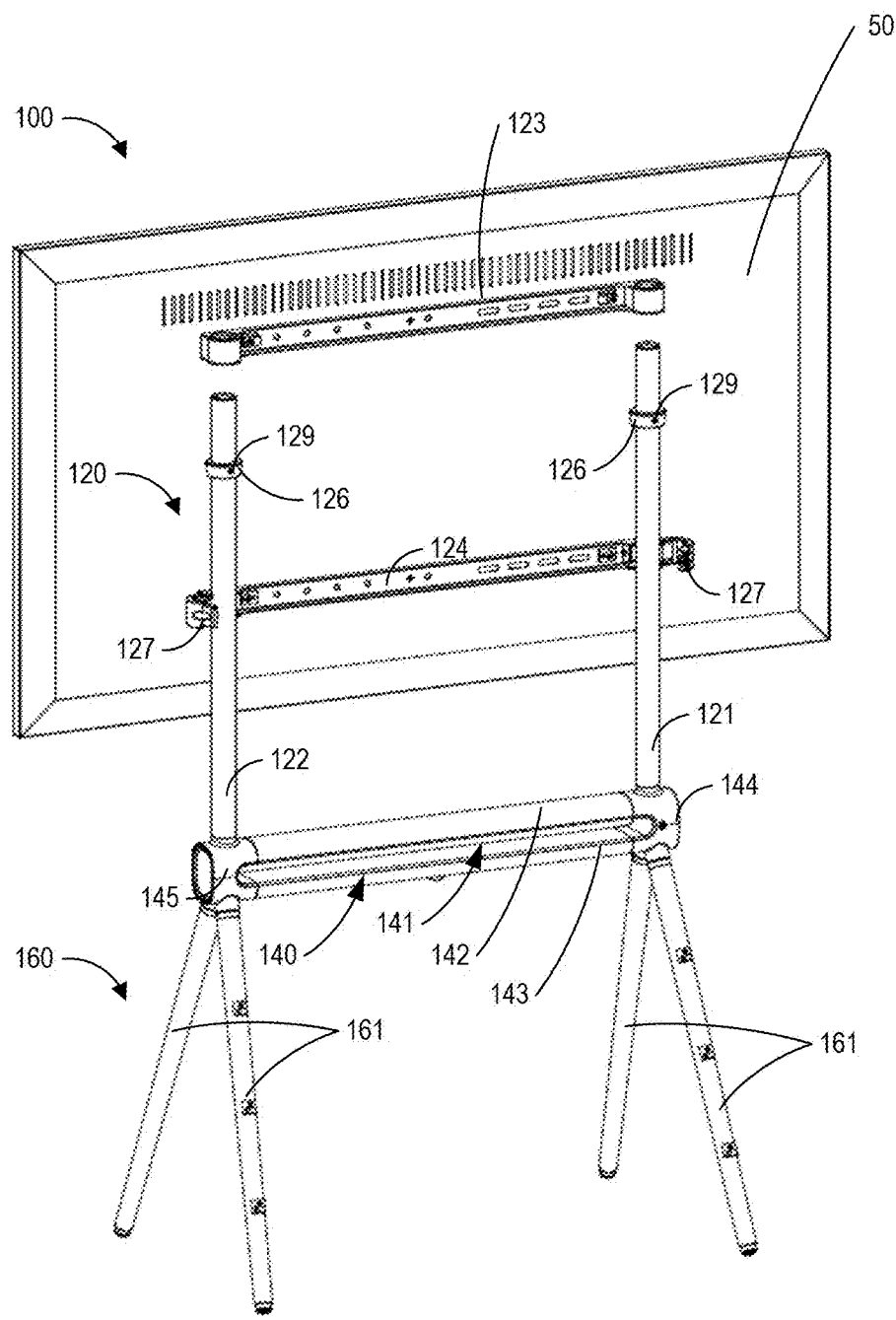
FIG. 10 is a back view of the multifunction display stand of FIG. 1 in a partially assembled state.
Figure 11:
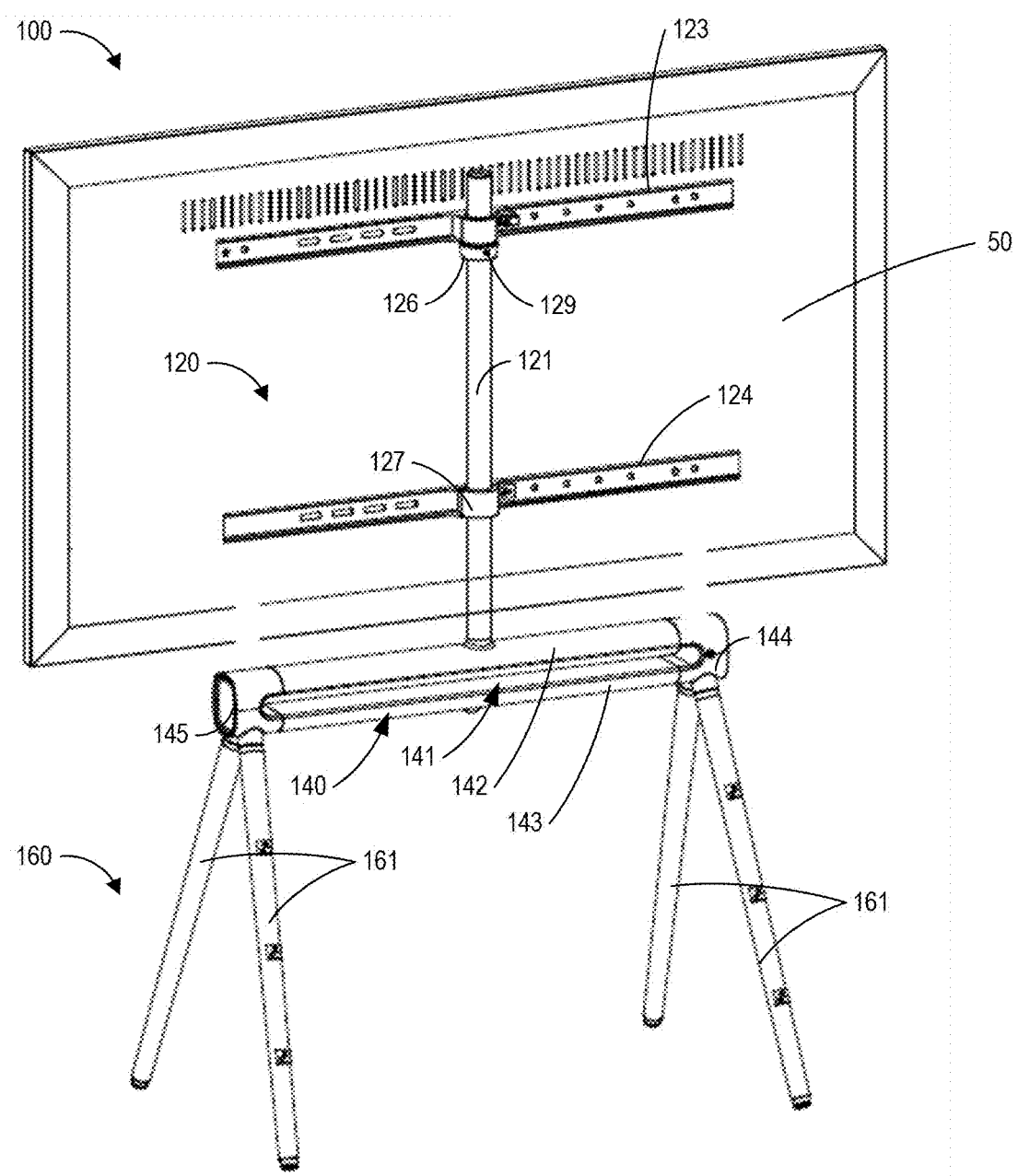
FIG. 11 is a back view of another embodiment of a multifunction display stand that includes a single support rod.
Figure 12:
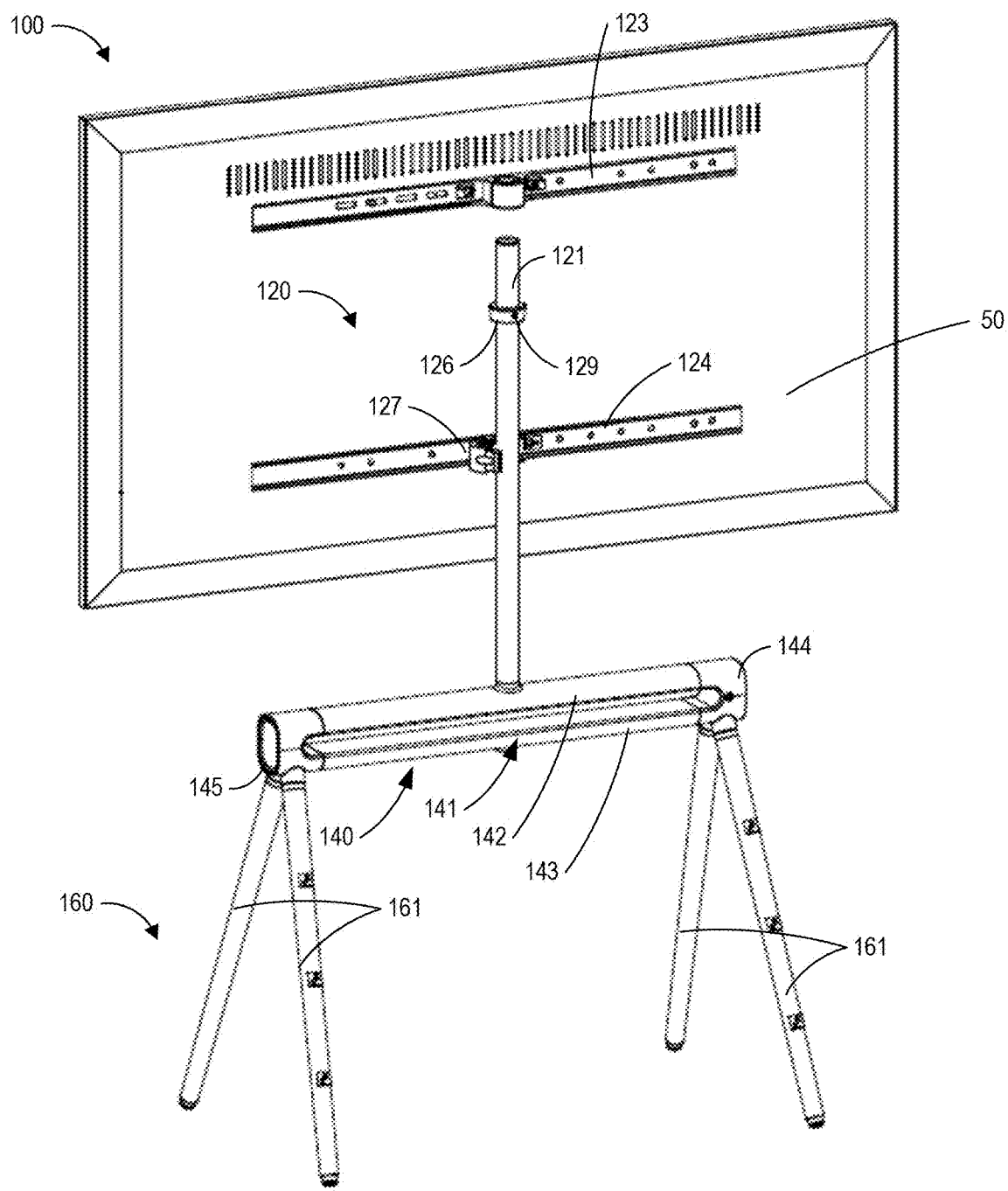
FIG. 12 is a back view of the multifunction display stand of FIG. 11 in a partially assembled state.

Although the display mount assembly 120 is not visible in FIG. 1 (because it is positioned behind the display 50), one embodiment of the display mount 120 is shown in FIGS. 2 and 3, which illustrate the display stand 100 with the display 50 removed and in FIGS. 9 and 10, which illustrate rear views of the display stand 100. This embodiment will be described in more detail below. However, those of ordinary skill in the art will appreciate that this disclosure should not be limited to this particular illustrated embodiment, and that other configurations for the display mount assembly 120 are possible, such as the additional embodiment including a single support rod 121 as illustrated in FIGS. 11 and 12.

The display mount assembly 120 can be configured to support various types of displays 50, including televisions, monitors (such as computer monitors), and others. For example, the display 50 may comprise a television, such as an LCD television, an LED television, an OLED television, a QLED television, a MicroLED television, a plasma television, or others. The display mount assembly 120 can be configured for use with televisions of different sizes, including, for example, televisions with screens measuring between 24 to 75 inches (measured along the diagonal), such as 32 inch, 42 inch, 48 inch, 50 inch, 55 inch, 60 inch, 65 inch, 70 inch, and 75 inch televisions. In some embodiments, the display 50 may comprise a television that is smaller than 24 inches or larger than 75 inches. The display 50 may also comprise a monitor, such as a computer monitor, which are available in a wide range of sizes from, for example, 13 to 29 inches or larger.

As illustrated in FIG. 1, the display stand 100 also include the multifunction hub assembly 140. As noted previously, the hub assembly 140 is configured to provide additional functionality for the display stand 100, such as lighting, power, air purification, audio, or others.

In the illustrated embodiment, the hub assembly 140 is positioned below the display 50, although other positions for the hub assembly 140 are possible. For example, the hub assembly 140 can be positioned above, to the right or left of, or even behind the display 50 in some embodiments. As better shown in FIGS. 2 and 3, in the illustrated embodiment, the display mount 120 is attached to the hub assembly 140, for example, extending upwardly from the hub assembly 140. Similarly, in the illustrated embodiment, the legs assembly 160 is attached to the hub assembly 140, extending downwardly from the hub assembly 140. Again, this specific configuration is provided by way of example and is not intended to be limiting. However, the illustrated embodiment shows that, for some implementations, the hub assembly 140 can provide some structural support for the display stand 140.

Exploded views of the hub assembly 140 are provided in FIGS. 4 and 5, which are described in more detail below. However, FIG. 1, for example, illustrates that the hub assembly 140 can include a recess 141 formed therein. The recess 141 can be a slot, channel, or opening that extends through the hub assembly 140. In some embodiments, the recess 141 does not extend entirely through the hub assembly 140, such that it is formed as a depression or cavity that extends partially into the hub assembly 140.

Figure 6:
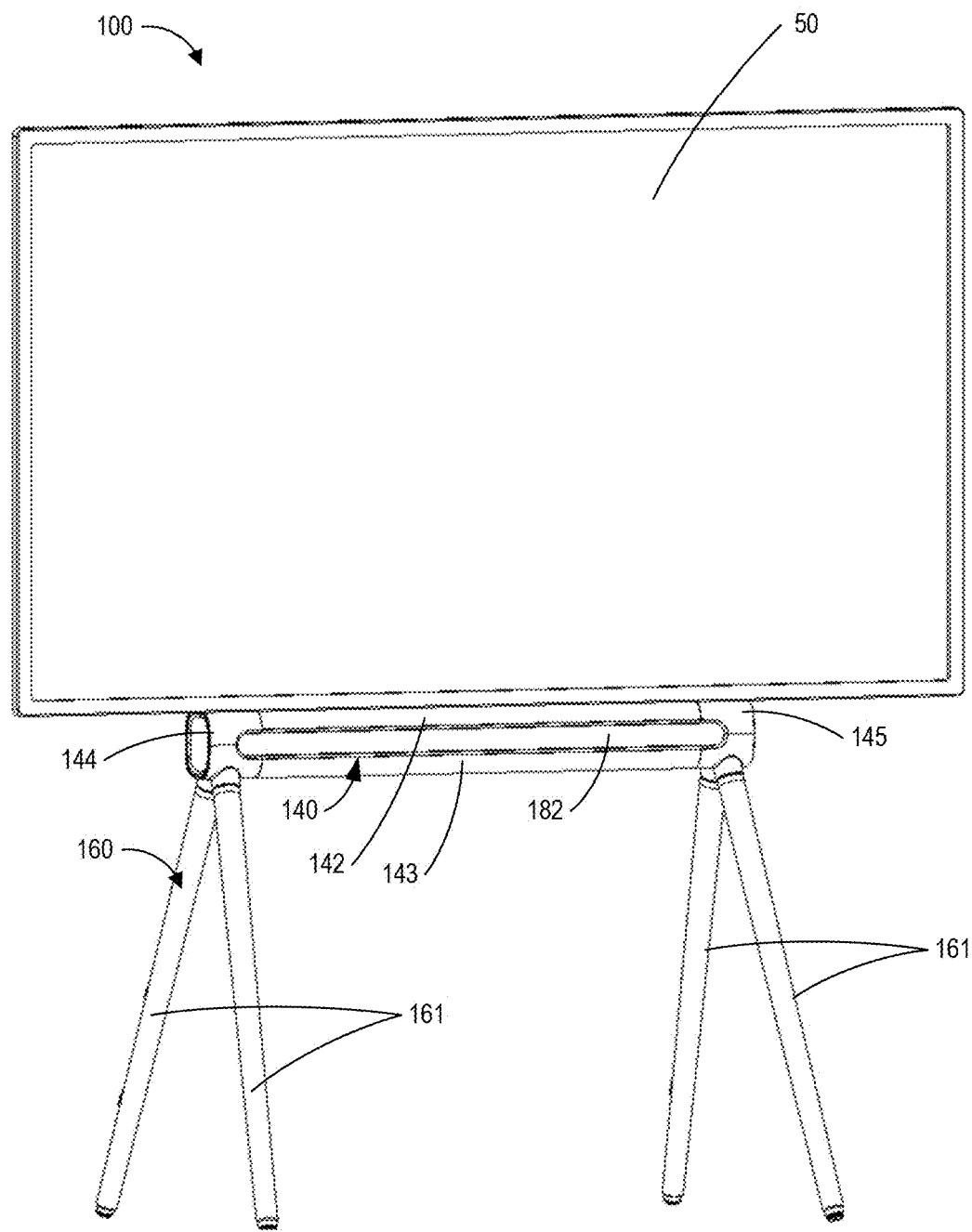
FIG. 6 illustrates a perspective view of an embodiment of the multifunction display stand of FIG. 1 with a display installed thereon and a mobile power supply positioned in the multifunction hub.
Figure 7:
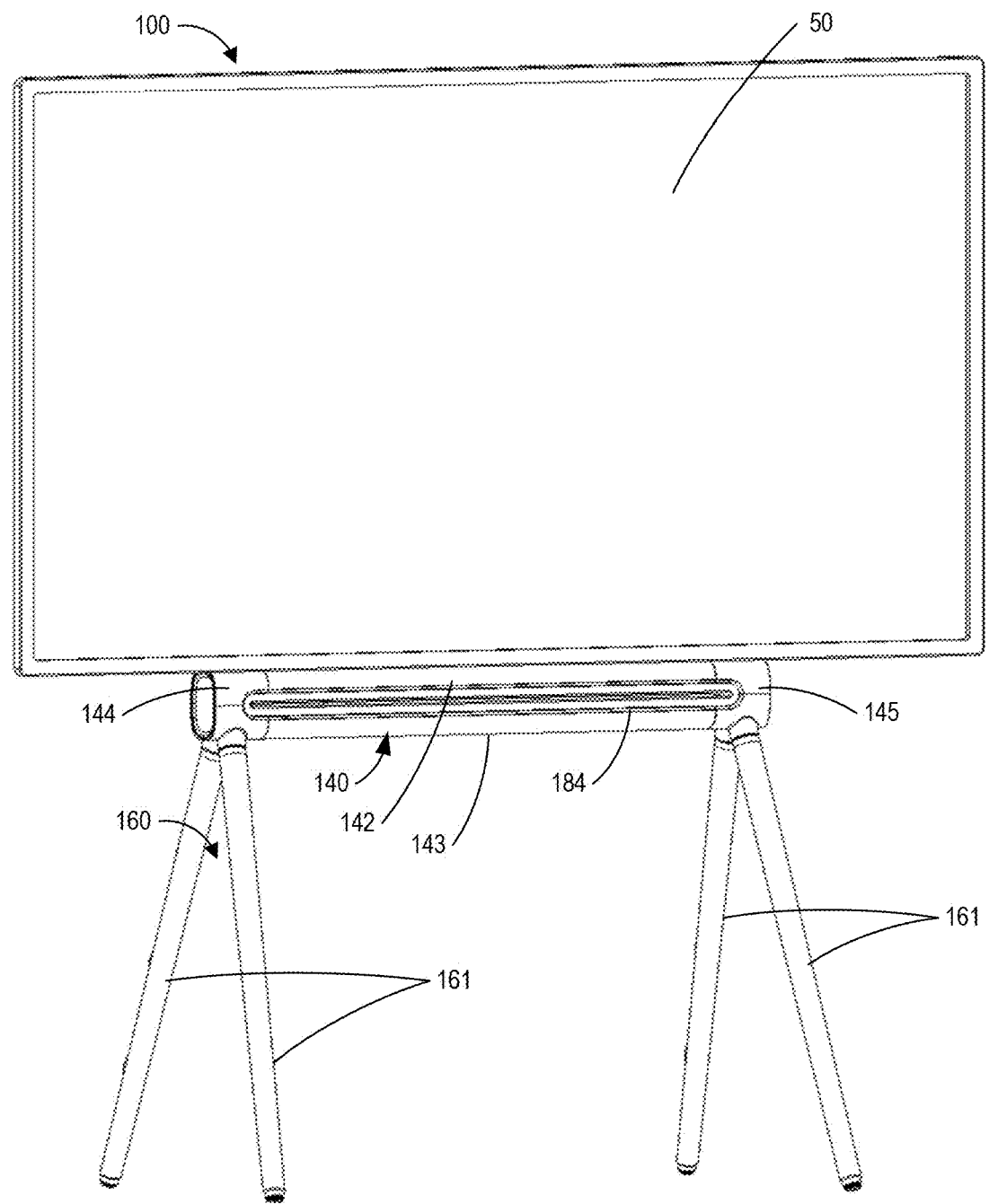
FIG. 7 is a perspective view of an embodiment of the multifunction display stand of FIG. 1 with a display installed thereon and an air purifier unit positioned in the multifunction hub.

As will be described in more detail below, the recess 141 can be configured to provide (or receive a module that provides) additional functionality for the display stand 100. For example, the recess 141 can include or be configured to receive a lighting element to provide lighting, a power supply unit to supply power, an air purifier unit to provide air purification, and/or a speaker unit to provide audio functionality. FIG. 4, for example, illustrates an example lighting element 151 integrated into the recess 141 of the hub assembly 140, which is described in more detail below. FIG. 6, for example, illustrates an example mobile power supply 182 positioned in recess 141 the hub assembly 140, which is described in more detail below. FIG. 7, for example, illustrates an example air purifier unit 184 positioned in the recess 141 of the hub assembly 140, which is described in more detail below. And, FIG. 8, for example, illustrates an example speaker unit 186 positioned in the recess 141 of the hub assembly 140, which is described in more detail below. As described herein, by including these types of features in the hub assembly 140, the hub assembly 140 can allow the display stand 100 to provide one or more other functions in addition to the traditional display support function.

As shown in FIG. 1, in the illustrated embodiment, the hub assembly 140 comprises an upper arm 142, a lower arm 143, a first end seat 144 (e.g. a left end seat relative to the orientation shown in the figure), and a second end seat 145 (e.g. a left end seat relative to the orientation shown in the figure). These pieces of the hub assembly 140 are described in more detail below with reference to the exploded views of FIGS. 4 and 5. As shown in FIG. 1, the recess 141 is formed between the upper arm 142, the lower arm 143, the first end seat 144, and the second end seat 145. Again, the illustrated embodiment is not intended to be limiting and other configurations are possible.

FIG. 1 also illustrates an embodiment of the legs assembly 160 for the display stand 100. The legs assembly 160 is configured to support and position the other components of the display stand 100. In the illustrated embodiment, the legs assembly 160 comprises four legs 161 extending downwardly from the hub assembly 140. In the illustrated embodiment, two legs 161 are positioned on each end (e.g., left and right ends) of the hub assembly 140 and extend downwardly at an angle relative to each other. Other configuration for the legs 161 are also possible.

In some embodiments, the legs assembly 160 can be replaced with another type of support structure. For example, the legs assembly 160 can be replaced with a single pillar that rests on a pedestal. As another example, the legs assembly 160 can be replaced with a cabinet or shelving unit that supports the other components of the display stand 100. In some embodiments, the legs assembly 160 (or other type of support structure) includes wheels, such that the display stand 100 can be mobile. For example, wheels can be included on the distal ends of the legs 160.

FIG. 2 is a perspective view of the multifunction display stand 100 with the display 50 removed therefrom. With the display 50 removed, the display mount assembly 120 is visible, as well as the multifunction hub assembly 140, and the legs assembly 160.

As shown in FIG. 2, in the illustrated embodiment, the display mount assembly 120 may comprise a first support rod 121, a second support rod 122, an upper cross beam 123, and a lower cross beam 124 arranged so as to provide a structure to which the display 50 can be mounted. In the illustrated embodiment, the first support rod 121 comprises a cylindrical rod, although other shapes for the first support rod 121, for example, having square, rectangular, or otherwise shaped cross-sections. In the illustrated embodiment, the first support rod 121 extends upwardly from the first end seat 144, which is positioned on the left side of the hub assembly 141 (relative to the orientation shown in the figure). The upper and lower cross beams 123, 124 can be attached to the first support rod 121.

In the illustrated embodiment, the second support rod 122 comprises a cylindrical rod, although other shapes for the second support rod 122, for example, having square, rectangular, or otherwise shaped cross-sections. In the illustrated embodiment, the second support rod 122 extends upwardly from the second end seat 145, which is positioned on the right side of the hub assembly 141 (relative to the orientation shown in the figure). The upper and lower cross beams 123, 124 can be attached to the second support rod 122.

The upper and lower crossbeams 123, 124 can extend between the first and second support rods 121, 122. In the illustrated embodiment, the upper and lower crossbeams 123, 124 are configured to provide mounting points to which the display 50 can be mounted. For example, in the illustrated embodiment, each of the upper and lower crossbeams 123, 124 can include mounting holes 125. The mounting holes 125 can be configured to receive fasteners (e.g., mechanical fasteners) therethrough that attach to the display 50 to secure the display 50 to the display mount assembly 120. The mounting holes 125 can be provided at different intervals or locations along the upper and lower crossbeams 123, 124 to allow for attachment of different sized displays 50. Further, in some embodiments, some or all of the mounting holes 125 can comprise slots that are configured to further accommodate mounting displays 50 of different sizes.

In some embodiments, the mounting holes 125 are used to attach the display 50 directly to the upper and/or lower crossbeams 123, 124. In other embodiments, the mounting holes 125 are configured to attach to an intermediary mount that is positioned between the upper and lower crossbeams 123, 124 and the display 50. For example, the intermediary mount can comprise a fixed bracket, a tilting bracket, or full-motion brackets, among others. Tilting or full-motion brackets may allow the display 50 to have some degree of freedom or motion relative to the display mount assembly 120.

In some embodiments, the positions of one or both of the upper and/or lower crossbeams 123, 124 can be fixed with respect to the first and second support rods 121, 122. In other embodiments, the positions of one or both of the upper and/or lower crossbeams 123, 124 can be adjustable with respect to the first and second support rods 121, 122. Adjustability of one or both of the upper and/or lower crossbeams 123, 124 with respect to the first and second support rods 121, 122 can be advantageous as it can allow the spacing and position between the upper and lower crossbeams 123, 124 to be adjustable so as to accommodate mounting of displays 50 of different sizes.

In the illustrated embodiment, the position of the upper crossbeam 123 is adjustable. For example, as shown in FIG. 126, the upper crossbeam 123 is supported on the first and second support rods 121, 122 by collars 126 positioned on each of the first and second support rods 121, 122. In some embodiments, the collars 126 can slide up and down the first and second support rods 121, 122, and then be locked into position at a desired height to support the upper crossbeam 123. In some embodiments, the lower crossbeam 124 can also be supported by collars 126 such that the height of the lower crossbeam 124 can also be adjusted. The collars 126 can be secured to the first and second support rods 121, 122 with grub screws or other mechanisms that allow them to remain fixed in place along the first and second support rods 121, 122. In some embodiments, the collars 126 can omitted, and other mechanisms for securing the upper and lower crossbeams 123, 124 to the first and second support rods 121, 122 can be used. For example, mechanical fasteners can extend through the upper and lower crossbeams 123, 124 and into the first and second support rods 121, 122 to secure the upper and lower crossbeams 123, 124 to the first and second support rods 121, 122. The first and second support rods 121, 122 can include openings at different positions along their lengths that would allow the upper and lower crossbeams 123, 124 to be secured to the first and second support rods 121, 122 at different positions so as to allow adjustment. However, use of collars 126 (or other similar structures) on at least one of the upper or lower crossbeams 123, 124 may be advantageous as this allows for continuous adjustment of the height of the upper or lower crossbeams 123, 124.

FIGS. 9 and 10, described below, illustrate rear views of the display stand 100, which also show these features, including an example of how the position of the upper and lower crossbeams 123, 124 can be adjustable. FIGS. 11 and 12, which are described in more detail below, illustrate rear views of an additional embodiment of the display stand 100, which includes a single support rod 121 positioned.

Like FIG. 1, FIG. 2 also illustrates the multifunction hub assembly 140 comprising the recess 141. As before, the recess 141 is formed between the upper arm 142, the lower arm 143, the first end seat 144, and the second end seat 145. As noted previously, the recess 141 can be configured to receive a lighting element to provide lighting, a power supply unit to supply power, an air purifier unit to provide air purification, and/or a speaker unit to provide audio functionality.

FIG. 2 also illustrates the legs assembly 160, comprising four legs 161. As shown in FIG. 2, the rear legs 161 may include one or more wire clips 162 (better shown in FIG. 3). The wire clips 162 can be configured to secure wires to the rear legs 161 such that cables can be hidden behind the legs 161, providing for a neat and clean appearance when the display stand 100 is used.

FIG. 3 is a partially exploded view of the multifunction display stand 100 including the display mount assembly 120, the multifunction hub assembly 140, and the legs assembly 160. FIG. 3 is helpful in understanding how, according to the illustrated embodiment, the display mount assembly 120 and the legs assembly 160 can attach to the hub assembly 140. As noted previously, the illustrated embodiment is, however, not intended to be limiting.

As shown in FIG. 3, the hub assembly 140 include threaded ends 146. The threaded ends 146 can extend upwardly from the hub assembly 140. In the illustrated embodiment, the threaded ends 146 extend from the first end seat 144 and the second end seat 145. In some embodiments, the threaded ends 146 are integrally formed with the first and second end seats 144, 145. In some embodiments, the threaded ends 146 are separate pieces that are attached to the first and second end seats 144, 145.

The threaded ends 146 can be configured to attach the display mount assembly 120 to the hub assembly 140. For example, in the illustrated embodiment, the threaded ends 146 are configured to be received into the lower ends of the first and second support rods 121, 121. Accordingly, in some embodiments, the lower ends of the first and second support rods 121, 121 can also be threaded so as to engage with the threaded ends 146. In other embodiments, this configuration can be reversed. For example, the first and second end seats 144, 145 can include threaded receptacles, and the lower ends of the first and second support rods 121, 122 can include threaded ends configured to be received within the threaded receptacles. Other structural configurations for attaching the display mount assembly 120 to the hub assembly 140 are also possible.

FIG. 3 also illustrates an embodiment of how the legs assembly 160 can attach to the hub assembly 140. For example, in the illustrated embodiment, the upper ends of the legs 161 comprise threaded ends 164. In the illustrated embodiment, the threaded ends 164 comprise bolts extending outwardly from the upper ends of the legs 161. The hub assembly 140 comprises corresponding structures configured to receive the threaded ends 164 of the legs 164. For example, in the illustrated embodiment, the first and second end seats 144, 145 comprise threaded receptacles 147 configured to receive the threaded ends 164 of the legs 161. Similar to the discussion above with respect to the threaded ends 164 and support rods 121, 122, the mechanical structure that attaches the legs 161 to the hub assembly 140 can be reversed. For example, the threaded ends can extend downwardly from the first and second end seats 144, 145 and into corresponding threaded receptacles on the upper ends of the legs 161. Other structural configurations for attaching the legs assembly 140 to the hub assembly 160 are also possible.

Like FIGS. 1 and 2, FIG. 3 also illustrates the multifunction hub assembly 140 comprising the recess 141. As before, the recess 141 is formed between the upper arm 142, the lower arm 143, the first end seat 144, and the second end seat 145. As noted previously, the recess 141 can be configured to receive a lighting element to provide lighting, a power supply unit to supply power, an air purifier unit to provide air purification, and/or a speaker unit to provide audio functionality.

FIG. 3 also illustrates the legs assembly 160, comprising four legs 161. As shown in FIG. 2, the rear legs 161 may include one or more wire clips 162 (better shown in FIG. 3). The wire clips 162 can be configured to secure wires to the rear legs 161 such that cables can be hidden behind the legs 161, providing for a neat and clean appearance when the display stand 100 is used. As shown in FIG. 3, fasteners 163 can be used to secure the wire clips 162 to the legs 161. The fasteners 163 may comprise mechanical fasteners (such as screws or bolts, for example) or adhesive fasteners (such as glue or adhesive tape, for example).

FIGS. 4 and 5 are bottom and top perspective exploded views, respectively, of an embodiment of the multifunction hub assembly 140. As described throughout this application, the hub assembly 140 can be configured to provide additional functionality for the display stand. For example, as noted previously, the hub assembly 140 can be configured to include or receive a module or unit configured to provide lighting, power, air purification, and/or audio, or other functionality. In the illustrated embodiment, the hub assembly 140 comprises a recess 141 configure to include or receive a lighting element 155 to provide lighting, a power supply unit to supply power (see FIG. 6), an air purifier unit to provide air purification (see FIG. 7), and/or a speaker unit to provide audio functionality (see FIG. 8).

FIGS. 4 and 5 illustrate in more detail an example embodiment of the hub assembly 140 in exploded form. As shown, the hub assembly 140 can include the first and second end seats 144, 145 on opposing (e.g., right and left) ends. Between the first and second end seats 144, 145 the hub assembly 140 can include the upper and lower arms 142, 143. As shown in FIGS. 4 and 5, the first and second end seats 144, 145 can each include an upper flange 148 and a lower flange 149. The upper and lower flanges 148, 149 can be configured to be received within recessed ends 151 of the upper and lower arms 142, 143. For example, the upper flanges 148 can be configured to be received within the recessed ends 151 of the upper arm 142 and the lower flanges 149 can be configured to be received within the recessed ends 151 of the lower arm 143. The upper and lower flanges 148, 149 can be spaced apart such that, when connected to the upper and lower arms 142, 143, the upper and lower arms 142, 143 are spaced apart to form the recess 141 therebetween.

As shown, fasteners 152 (e.g., mechanical fasteners, such as bolts or screws) can extend through the first and second end seats 144, 145 and into the recessed ends 151 of the upper and lower arms 142, 143 to secure the upper and lower arms 142, 143 to the first and second ends seats 144, 145. In the illustrated embodiment, four fasteners 152 are used on each end, with two fasteners 152 for each end of the upper and lower arms 142, 143. Other numbers of fasteners 152 and/or other types of fasteners 152 can be used. For example, in some embodiments, the fasteners 152 can be replaced with clips or snaps, such that the upper and lower arms 142, 143 snap into a locked configuration with the first and second end seats 142, 143. Covers 153, 154 can be provided to close open ends of the first and second end seats 144, 145.

FIGS. 4 and 5 also illustrate additional detail of the threaded ends 146 and threaded receptacles 147 that are used to connect the hub assembly 140 to the display mount assembly 120 and the legs assembly 160, respectively.

FIG. 4 also illustrates that a lighting element 155 to provide lighting can be integrated into the upper arm 145. The lighting element 155 can include, for example, an LED strip or other type of lighting element. In some embodiments, the lighting element 155 can be, additionally or alternatively, integrated into the lower arm 143. In some embodiments, the lighting element 155 can be provided on a module or unit that is configured to be received within the recess 141 of the hub assembly 140. Wiring or other electronic components configured to enable the lighting element 155 can be integrated into the hub assembly 140 as well.

The lighting element 155 can be configured to provide, for example, ambient or mood lighting while using the display 50. Advantageously, this can allow the display stand 100 to provide additional functionality (e.g., lighting) in addition to the more conventional display support functionality provided by other display stands 100.

FIG. 6 illustrates a perspective view of an embodiment of the multifunction display stand 100 with a display 50 installed thereon and a mobile power supply 182 positioned in the hub assembly 140. In the illustrated embodiment, the mobile power supply 182 is configured as a unit or module configured to be received within the recess 141 of the hub assembly 140. In this manner, the mobile power supply unit 182 can be installed and removed as desired or need. In other embodiments, the mobile power supply unit 182 can be integrated permanently into the hub assembly 140.

The mobile power supply unit 182 can be configured to provide power to operate the display 50 and/or other devices. This can allow the display stand 100 to be highly mobile as the display 50 can be powered without attaching to a wall outlet. In some embodiments, this can even allow the display stand 100 to be used outside. The mobile power supply unit 182 can include outlets (or other electrical connections) on the rear side thereof (the side opposite the side shown in FIG. 6) such that components, such as the display 50 can be attached thereto, while allowing the wires to remain hidden providing a neat and tidy appearance.

The mobile power supply unit 182 can include one or more batteries. The batteries can be rechargeable. The batteries can be, for example, lithium ion batteries, nickel cadmium batteries, nickel metal hydride batteries, lead acid batteries, lithium-ion polymer batteries, as well as other types of batteries. The mobile power supply unit 182 can also include power converters or transformers configured to provide power at proper voltage and amperages for the devices to be powered thereby.

In some embodiments, the mobile power supply unit 182 can be self-contained and configured to slide into and out of the recess 141 such that it can easily be installed or removed as desired. Accordingly, the shape or profile of the mobile power supply unit 182 can be configured to correspond to the shape of the recess 141. The recess 141 and the mobile power supply unit 182 can include engagement structures configured to removably secure the mobile power supply unit 182 therein.

FIG. 7 is a perspective view of an embodiment of the multifunction display stand 100 with a display 50 installed thereon and an air purifier unit 184 positioned in the multifunction hub. In the illustrated embodiment, the air purifier unit 184 is configured as a unit or module configured to be received within the recess 141 of the hub assembly 140. In this manner, the air purifier unit 184 can be installed and removed as desired or need. In other embodiments, the air purifier unit 184 can be integrated permanently into the hub assembly 140.

The air purifier unit 184 can be configured to purifier air in the vicinity of the display stand 100, thus providing additional functionality for the display stand 100. The air purifier unit 184 can comprise any suitable type of air purifier, including, for example, basic or HEPA filters, ionizers, ozone generators, electrostatic filters, activated carbon filters, UV light filters, or others. In some embodiments, the air purifier unit 184 can include an integrated power source for powering the air purifier unit 184, the display 50, and/or other peripheral devices. Accordingly, in some embodiments, the speaker unit 186 can comprise one or more batteries similar to those described above with respect to the mobile power supply unit 182.

In some embodiments, the air purifier unit 184 can be self-contained and configured to slide into and out of the recess 141 such that it can easily be installed or removed as desired. Accordingly, the shape or profile of the air purifier unit 184 can be configured to correspond to the shape of the recess 141. The recess 141 and the air purifier unit 184 can include engagement structures configured to removably secure the air purifier unit 184 therein.

Figure 8:
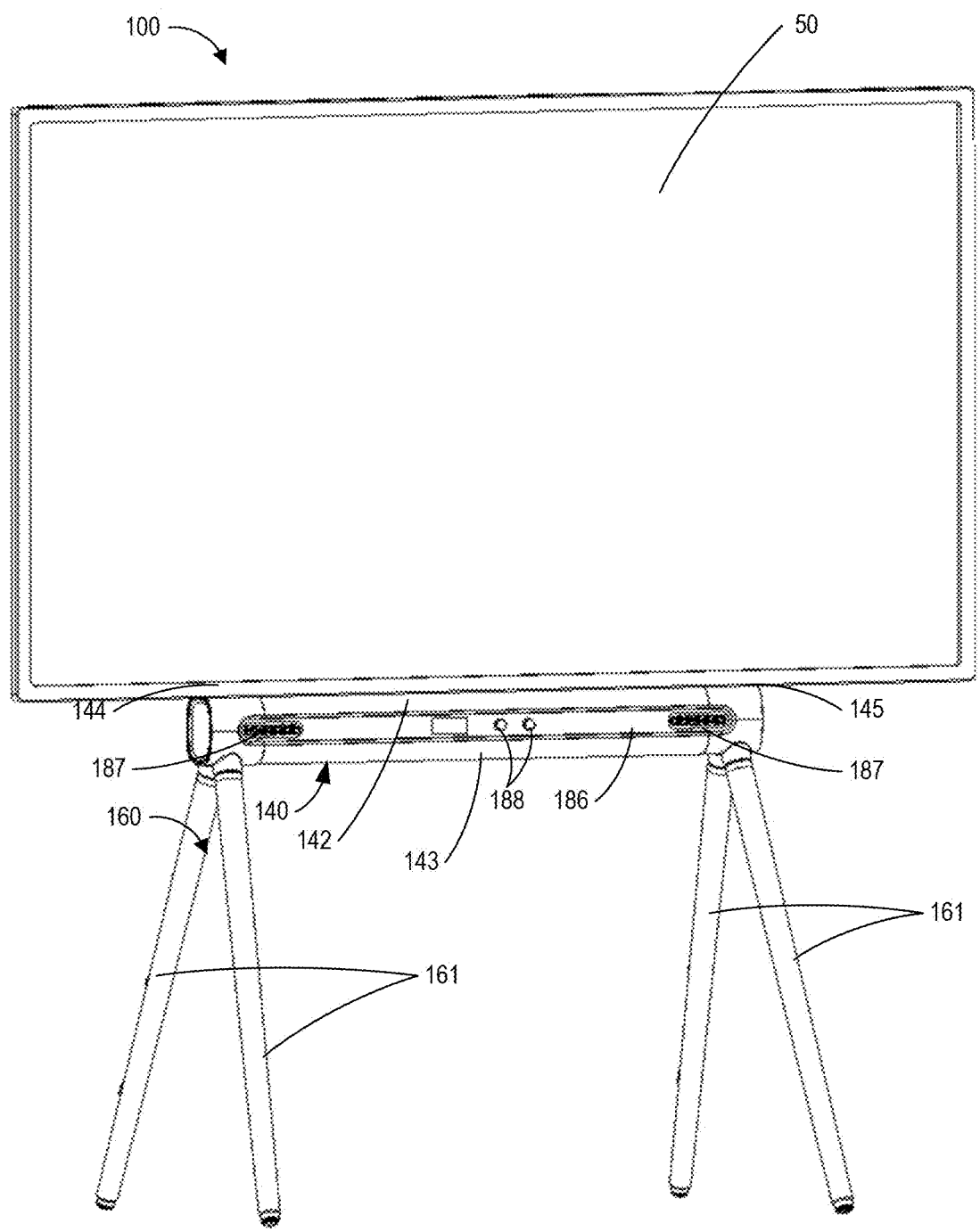
FIG. 8 is a perspective view of an embodiment of the multifunction display stand of FIG. 1 with a display installed thereon and speaker unit positioned in the multifunction hub.

FIG. 8 is a perspective view of an embodiment of the multifunction display stand of FIG. 1 with a display installed thereon and speaker unit 186 positioned in the multifunction hub. In the illustrated embodiment, the speaker unit 186 is configured as a unit or module configured to be received within the recess 141 of the hub assembly 140. In this manner, the speaker unit 186 can be installed and removed as desired or need. In other embodiments, the speaker unit 186 can be integrated permanently into the hub assembly 140.

Often, displays 50 may include low quality speakers or in some cases no speakers at all. Accordingly, it can be advantageous to provide the display stand 100 with the speaker unit 186 to enable or improve the quality of audio during use. In the illustrated embodiment, the speaker unit 186 comprises one or more speakers 187, as well as controls 188 for operating the same. In some embodiments, the speaker unit 186 can include an integrated power source for powering the speaker unit 186, the display 50, and/or other peripheral devices. Accordingly, in some embodiments, the speaker unit 186 can comprise one or more batteries similar to those described above with respect to the mobile power supply unit 182.

In some embodiments, the speaker unit 186 can be self-contained and configured to slide into and out of the recess 141 such that it can easily be installed or removed as desired. Accordingly, the shape or profile of the speaker unit 186 can be configured to correspond to the shape of the recess 141. The recess 141 and the speaker unit 186 can include engagement structures configured to removably secure speaker unit 186 therein.

The mobile power supply unit 182, air purifier unit 184, speaker unit 186, and/or a lighting unit can be configured to be modular such that any can be used with the display stand 100 as desired. The modules or units can be configured such that can easily be swapped in our out of the display stand to provide the associated functionality as desired by the user, thus allowing the display stand 100 to provide multiple functions (which might not be associated with conventional display stands) in addition to the supporting the display 50.

FIG. 9 is a back view of the multifunction display stand 100, and FIG. 10 is a back view of the multifunction display stand 100 in a partially assembled state. As shown in FIG. 9, for example, the upper and lower cross beams 123, 124 can be attached to the rear of the display 50. For example, mechanical fasteners can be used in connection with the mounting holes 125 to attach the display 50 to the upper and lower cross beams 123, 124.

Further, the upper and lower cross beams 123, 124 can also be attached to the first and second support rods 121, 122. For example, in the illustrated embodiment of FIG. 9, the ends of the upper and lower cross beams 123, 124 an comprise loops, rings, holes, or apertures through which the first and second support rods 121, 122 can extend. As described above, in the illustrated embodiment, the upper crossbeam 123 is supported on the first and second support rods 121, 122 by collars 126 positioned on each of the first and second support rods 121, 122. The collars 126 can slide up and down the first and second support rods 121, 122, and then be locked into position at a desired height to support the upper crossbeam 123. As shown in FIG. 9, the collars 126 can be secured to the first and second support rods 121, 122 with a mechanical fastener 129. The mechanical fastener 129 can be, for example, a grub screw or other suitable fastener. During installation, the collars 126 can be slid to the desired height, the mechanical fastener 129 can be used to secure the collars 126 to the first and second support rods 121, 122, and the upper cross beam 123 can be lowered down to rest and be supported by the collars 126. This will be described in more detail below with respect to FIG. 10, which illustrates a partially assembled state of the display stand 100.

The lower crossbeam 124 can, in some embodiments, similarly be supported by a second set of collars 126. In the illustrated embodiment, however, the lower crossbeam 124 is configured with half-ring clamps 127. The half-ring clamps 127 can open to allow the first and second support rods 121, 122 to be positioned therein, and then secured around the first and second support rods 121, 122 with a clamping force that keeps the lower crossbeam 124 in place. FIG. 9 illustrates the half-ring clamps 127 in a closed position. FIG. 10 illustrates the half-ring clamps 127 in an open position. In the closed position, the half-ring clamps 127 form a loop around the first and second support rods 121, 122 and can be secured by a fastener 129, latch, or other suitable structure. In some embodiments, the upper crossbeam 123 can be configured in a manner similar to the lower crossbeam, for example, including half-ring clamps.

FIG. 10 is a back view of the multifunction display stand 100 in a partially assembled state. As illustrated, the collars 126 are secured to the first and second support rods 121, 122 using fasteners 129, and the half-ring clamps 127 of the lower crossbeam 124 are in an open position. From this position, the display 50 can be slid down onto the first and second support rods 121, 122 until the upper crossbeam 123 rests on the collars 126. The half-ring clamps 127 of the lower crossbeam 124 can then be closed around the first and second support rods 121, 122 and secured.

FIGS. 11 and 12 illustrate another embodiment of the multifunction display stand 100 that includes a single support rod 121. In many respects, the embodiment illustrated in FIGS. 11 and 12 is similar to the embodiment illustrate in FIG. 1. Similar components, including the legs or support assembly 160 and multifunction hub assembly 140, for example, can be similar to those components described above.

As shown, in the illustrated embodiment of FIGS. 11 and 12, a single support rod 121 extends upwardly from the multifunction hub assembly 140 to which the display mount assembly 120 can attach. For example, as illustrated, the upper and lower cross beams 123, 124 can also attached to the single support rod 121. In the illustrated embodiment of FIG. 11, a center or central portion of the upper and lower cross beams 123, 124 can include a loop, ring, hole, or aperture through which the support rod 121 can extend. The upper crossbeam 123 can be supported on the support rod 121 by a collar 126 positioned the support rod 121. The collar 126 can slide up and down the support rod 121, and then be locked into position at a desired height to support the upper crossbeam 123. As shown in FIG. 11, the collar 126 can be secured to support rod 121 with a mechanical fastener 129. The mechanical fastener 129 can be, for example, a grub screw or other suitable fastener. During installation, the collar 126 can be slid to the desired height, the mechanical fastener 129 can be used to secure the collar 126 to the support rod 121, and the upper cross beam 123 can be lowered down to rest and be supported by the collar 126.

The lower crossbeam 124 can, in some embodiments, similarly be supported by a set of collar 126. In the illustrated embodiment of FIGS. 11 and 12, however, the lower crossbeam 124 is configured with a half-ring clamp 127. The half-ring clamp 127 can open to allow the support rod 121 to be positioned therein, and then secured around the support rod 121 with a clamping force that keeps the lower crossbeam 124 in place. FIG. 11 illustrates the half-ring clamp 127 in a closed position. FIG. 12 illustrates the half-ring clamp 127 in an open position. In the closed position, the half-ring clamp 127 forms a loop around the support rod 121 and can be secured by a fastener 129, latch, or other suitable structure. In some embodiments, the upper crossbeam 123 can be configured in a manner similar to the lower crossbeam, for example, including half-ring clamp.

FIG. 12 is a back view of the multifunction display stand 100 in a partially assembled state. As illustrated, the collar 126 is secured to the support rod 121 using fastener 129, and the half-ring clamp 127 of the lower crossbeam 124 is in an open position. From this position, the display 50 can be slid down onto the support rod 121 until the upper crossbeam 123 rests on the collar 126. The half-ring clamp 127 of the lower crossbeam 124 can then be closed around the support rod 121 and secured.

The embodiment of FIGS. 11 and 12 can, in some embodiments, allow the display to pivot right and left on the single support rod 121.

The foregoing description details certain embodiments of the systems, devices, and methods disclosed herein. It will be appreciated, however, that no matter how detailed the foregoing appears in text, the systems, devices, and methods can be practiced in many ways. As is also stated above, it should be noted that the use of particular terminology when describing certain features or aspects of the invention should not be taken to imply that the terminology is being redefined herein to be restricted to including any specific characteristics of the features or aspects of the technology with which that terminology is associated.

It will be appreciated by those skilled in the art that various modifications and changes may be made without departing from the scope of the described technology. Such modifications and changes are intended to fall within the scope of the embodiments. It will also be appreciated by those of skill in the art that parts included in one embodiment are interchangeable with other embodiments; one or more parts from a depicted embodiment can be included with other depicted embodiments in any combination. For example, any of the various components described herein and/or depicted in the figures may be combined, interchanged or excluded from other embodiments.

The above description discloses several methods and materials of the present invention. This invention is susceptible to modifications in the methods and materials, as well as alterations in the fabrication methods and equipment. Such modifications will become apparent to those skilled in the art from a consideration of this disclosure or practice of the invention disclosed herein. Consequently, it is not intended that this invention be limited to the specific embodiments disclosed herein, but that it cover all modifications and alternatives coming within the true scope and spirit of the invention as embodied in the attached claims. Applicant reserves the right to submit claims directed to combinations and sub-combinations of the disclosed inventions that are believed to be novel and non-obvious. Inventions embodied in other combinations and sub-combinations of features, functions, elements and/or properties may be claimed through amendment of those claims or presentation of new claims in the present application or in a related application. Such amended or new claims, whether they are directed to the same invention or a different invention and whether they are different, broader, narrower or equal in scope to the original claims, are to be considered within the subject matter of the inventions described herein.

What is claimed is:

1. A multifunction display stand configured to support a display, the display stand comprising:
   a display mount assembly configured to mount to and support a display, wherein the display comprises a television or a computer monitor;
   a hub assembly comprising a recess, wherein the display mount extends from the hub assembly, and wherein the hub assembly further comprises:
   a first end seat,
   a second end seat,
   an upper arm extending between the first and seat and the second end seat, and
   a lower arm extending between the first end seat and the second end seat,
   wherein the recess is formed between the upper arm and the lower arm, and wherein each of the first end seat and the second end seat comprise upper and lower flanges configured to be received within recessed ends of the upper and lower arms;
   a modular unit positioned in the recess of the hub assembly, the modular unit comprising one of: a lighting unit, a mobile power supply unit, an air purifier unit, and a speaker unit; and
   a legs assembly extending from and configured to support the hub assembly.

2. The display stand of claim 1, wherein the recess comprises a profile configured to correspond to the profile of the modular unit such that the modular unit is configured to be received within the recess.

3. The display stand of claim 1, further comprising a lighting element integrated into at least one of the upper arm or the lower arm of the hub assembly.

4. The display stand of claim 1, wherein the modular unit comprises the mobile power supply unit, and the mobile power supply unit comprises one or more rechargeable batteries configured to power a display supported by the display stand.

5. The display stand of claim 1, wherein the modular unit comprises the air purifier unit, and the air purifier unit comprises a HEPA filter, an ionizes, an ozone generator, an electrostatic filter, an activated carbon filter, or a UV light filter.

6. The display stand of claim 5, wherein the air purifier unit comprises one or more rechargeable batteries configured to power a display supported by the display stand and the air purifier unit.

7. The display stand of claim 1, wherein the modular unit comprises the speaker unit, and the speaker unit comprises one or more speakers.

8. The display stand of claim 7, wherein the speaker unit comprises one or more rechargeable batteries configured to power a display supported by the display stand and the speaker unit.

9. A multifunction display stand configured to support a display, the display stand comprising:
   a hub assembly comprising a recess;
   a modular unit removably received in the recess of the hub assembly, the modular unit comprising one of: a lighting unit, a mobile power supply unit, an air purifier unit, and a speaker unit;
   a display mount assembly configured to mount to and support a display, wherein the display comprises a television or a computer monitor, and wherein the display mount assembly comprises:
   at least one support rod extending upwardly from the hub assembly; and
   upper and lower crossbeams are attached to the support rod, wherein the upper and lower crossbeams configured to mount to the display, wherein a height of at least one of the upper and lower crossbeams on the at least one support rod is adjustable;
   collars positioned on the support rod for supporting the at least one of the upper and lower crossbeams that is adjustable; and
   a legs assembly.

10. The display stand of claim 1, comprising half-ring clamps positioned on the upper or lower crossbeams configured to open and close for connecting to the at least one support rod.

* * * * *